United States Patent
Guidotti et al.

(12)

(10) Patent No.: US 6,291,801 B1
(45) Date of Patent: Sep. 18, 2001

(54) CONTINUAL FLOW RAPID THERMAL PROCESSING APPARATUS AND METHOD

(75) Inventors: Daniel Guidotti, Yorktown Heights; Kam Leung Lee, Putnam Valley, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/614,935

(22) Filed: Jul. 12, 2000

Related U.S. Application Data

(62) Division of application No. 08/870,355, filed on Jun. 5, 1997, now Pat. No. 6,114,662.

(51) Int. Cl.[7] ................................................ F27B 5/14
(52) U.S. Cl. .................. 219/390; 219/405; 392/418; 118/724; 414/217
(58) Field of Search .................. 219/390, 388, 219/393, 399, 405, 406, 407, 411; 392/416, 418; 118/724, 725, 50.1; 414/217; 165/133; 432/121, 156; 250/492.2

(56) References Cited

U.S. PATENT DOCUMENTS

| | | | |
|---|---|---|---|
| 4,430,149 | * | 2/1984 | Berkman .............................. 156/613 |
| 4,481,406 | * | 11/1984 | Muka ................................... 219/411 |

* cited by examiner

*Primary Examiner*—Teresa Walberg
*Assistant Examiner*—Shawntina Fuqua
(74) *Attorney, Agent, or Firm*—Robert M. Trepp; Randy W. Tung

(57) ABSTRACT

A rapid thermal processing apparatus and a method of using such apparatus for the continuous heat treatment of at least one workpiece, which apparatus includes a cavity of generally elongated shape, a process chamber defined by interior walls inside the cavity, a device for delivering, regulating and extracting process gases from the chamber, a device for transporting at least one workpiece through the chamber in a substantially forward direction, a device for heating at least a section of the chamber, and a device for cooling the at least one workpiece downstream from the heating device. The cavity for the apparatus may also be provided in either a curved or a linear configuration for carrying out the present invention method.

12 Claims, 7 Drawing Sheets

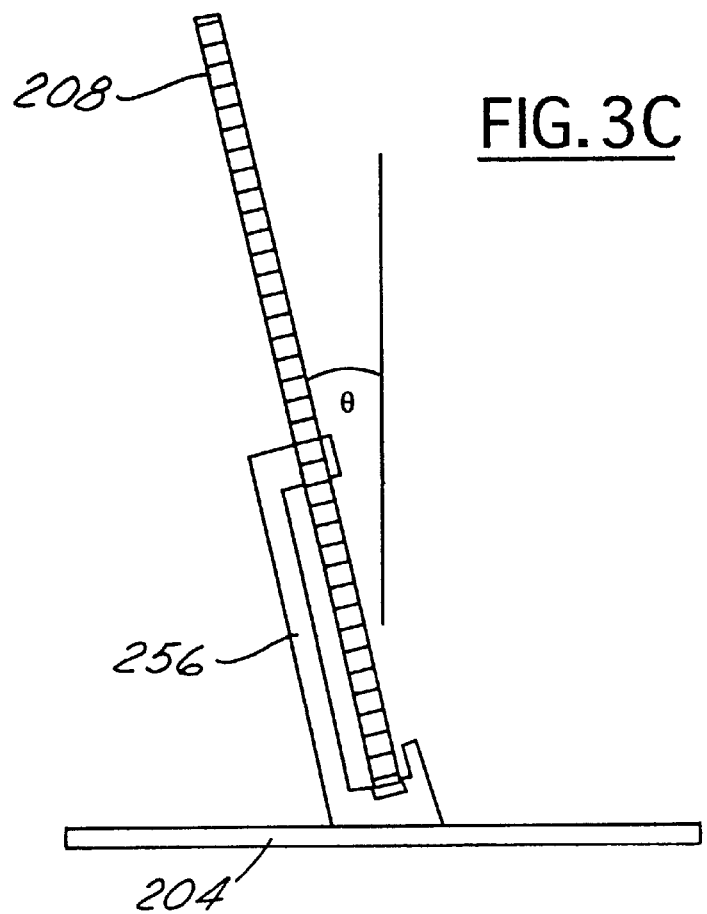
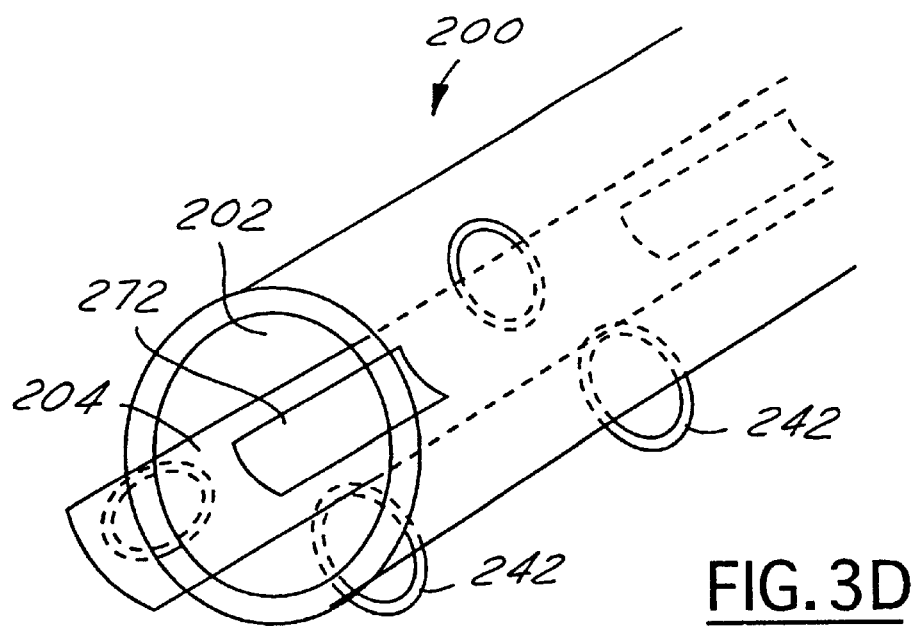

CONTINUAL FLOW RAPID THERMAL PROCESSING APPARATUS AND METHOD

This is a divisional of application Ser. No. 08/870,355 filed on Jun. 5, 1997 now U.S. Pat. No. 6,114,662.

FIELD OF THE INVENTION

The present invention generally relates to a method and an apparatus for the rapid thermal processing of at least one workpiece and more particularly, relates to a method and an apparatus for the rapid thermal processing of at least one workpiece which can be rapidly heated/cooled by exposing the workpiece to a time dependent, continuous convolution of nearly black body distributions of electromagnetic radiation in the presence of processing gases or in vacuum.

BACKGROUND OF THE INVENTION

In the high volume fabrication of semiconductor integrated circuit devices, the technique of rapid thermal processing (RTP) or rapid thermal annealing (RTA) has become an important processing step in the fabrication of IC devices. In a conventional RTP process, a workpiece is heated by a heat source such as a plurality of tungsten-halogen lamps or arc lamps which provides almost instant heating effect on a workpiece such as a semiconducting substrate in the shape of a wafer In most RTP methods, the heat treatment of a wafer takes place in a single process chamber with the appropriate process gas flow and composition.

A typical single-wafer RTP chamber 10 is shown in FIG. 1A. In RTP chamber 10, an outer chamber wall 12 made of metal is cooled by ambient air and liquid circulating in cooling channels 14. The wafer 18 and the wafer supports 20 are situated inside a fused silica inner chamber wall 24 equipped with a process gas inlet 26 and outlet 28. The wafer 18 supported by the fused silica supports 20 is heated radiatively by banks of lamps 22 of either tungsten-halogen or arc-type lamps.

The mode of heating provided by the RTP chamber 10 shown in FIG. 1A is dynamic in that the wafer never reaches thermal equilibrium with the heating elements. As a result, the temperature uniformity over the wafer surface depends on the heating rate of the wafer. Furthermore, the radiative coupling between the wafer and the heating lamps varies greatly with temperature due to the fact that the emissivity of silicon depends strongly on temperature up to about 700° C. In addition, the radiative coupling depends on the physical state of the wafer front and back surfaces. During a typical RTP process as that shown in FIG. 1A, the wafer 18 is heated on both the top and the bottom surfaces and heat from the wafer radiates to cold wall surfaces. Based on this simultaneous heating and cooling, the rate of wafer heating and the wafer final temperature depend strongly on the wafer emissivity, which is in turn a strong function of the wafer surface structure, the wafer backside textures film stack, and wafer temperature.

Another conventional lamp based RTP chamber 30 is shown in FIG. 1B. In this chamber design, a semiconductor wafer 32 to be processed is placed on a susceptor 34 which can be raised up or down by an elevator 36. The lamp heaters 40 which are enclosed in a reflective dome 42 direct radiative energy toward the wafer 44. Process gases are pumped into chamber 46 through gas inlet 48 and exhausted through outlet 52. It should be noted that, unlike the chamber construction shown in FIG. 1A, the susceptor 34 is heated simultaneously with the wafer and aids in achieving temperature uniformity across the workpiece.

The present trends in semiconductor manufacturing indicate that in the near future the wafer heating rate and cooling rate will increase and that the time interval during which a wafer is maintained at a desired peak temperature will decrease substantially. The trends are dictated by high performance logic circuits that are based on very shallow junctions that must be prepared in a fabrication process with stringent thermal budget limitations. Moreover, in today's highly competitive environment, the manufacturing of semiconductor devices continues to strive for efficiency and throughput gains and thus, a more uniform and higher throughput RTP process is desired.

Conventional RTP chambers such as those shown in FIGS. 1A and 1B have performance limitations that limit their ability to meet future requirements of significantly faster heating rates. On the one hand, from a performance consideration, the ramp rate of conventional RTP chambers is limited by the requirement of temperature uniformity in the highly transient environment of conventional RTP chambers, which require feed-back control and independently addressable lamps in order to achieve an acceptable degree of temperature uniformity across the wafer workpiece. On the other hand, at the outer limits of tool performance the rate at which the wafer of a given size can be heated is limited by the time it takes for the lamp filament to achieve operational temperature and furthermore, by the radiant flux at the wafer. The latter is limited by how closely the heating lamps can be stacked together and the maximum radiant power flux of each lamp which is limited by the melting point of the tungsten filament and the softening point of the lamp's conventional fused silica enclosure. It has been found that the maximum achievable heating rate for an industry standard silicon wafer of 200 mm diameter in a conventional, lamp-based RTP chamber is limited to about 150° C./sec.

In recent years, RTP has also been conducted in vertical hot wall furnace-type chambers in limited applications. One of such devices is shown in FIG. 1C. A hot wall RTP furnace 50 is closed on all but one side (the bottom) through which wafers 54 are introduced and subsequently removed from the furnace upon completion of the thermal cycling treatment. The hot wall RTP furnace 50 has a vertical axis along which the wafers move by the action of elevator 66 on a wafer carrier 46 while maintaining the plane of the wafers perpendicular to the vertical ax of the chamber 50. The furnace 50 is closed at the top and is equipped with a top heater 58, and closed on the sides where side upper heaters 62 are mounted thereto. The furnace 50 has a chamber 64 defined by a fused silica chamber wall 76 and may include additional heating zones 68, each of which is maintained at a specific temperature. The wafers 54, positioned on wafer carrier 46 can be moved into or out of the chamber 64 by an elevator 66. The chamber 64 is further heated by lower side heaters 68 to facilitate the control of chamber temperature. Various process gases may enter the chamber 64 through gas inlet 72 and be exhausted from the chamber through gas outlet 74. During operation, wafers 54 are slowly transported vertically through one or more temperature zones coming to a full stop at a desirable location where the wafers achieve a temperature that is much less (100–500° C.) than that of the surrounding hot walls. After a suitable amount of time which may vary from several seconds to several minutes, the wafers can be withdrawn and allowed to cool. Limited by its basic design, the existing hot wall RTP furnace cannot achieve very high heating rates and short dwell times at a desirable wafer temperature.

Neither the lamp-based nor the hot wall-based RTP furnaces that are presently available can be used to process large workpieces (or wafers) at heating rates that are much higher than 150° C./sec and at dwell times at peak temperatures that are much shorter than one second. Therefore, prevailing art in current practice cannot meet the processing requirements for high performance logic circuits.

It is therefore an object of the present invention to provide a method and an apparatus for RTP that does not have the drawbacks and shortcomings of conventional lamp-based or hot wall-based RTP furnaces.

It is another object of the present invention to provide a method and an apparatus for RTP in which the temperature of at least one workpiece can be increased and decreased uniformly at rates that are much greater than 150° C./sec.

It is a further object of the present invention to provide a method and an apparatus for RTP which can be used to provide similar heating and cooling rates to wafers that are of common industrial sizes of 125 mm, 200 mm, 250 mm or 300 mm in diameter.

It is yet another object of the present invention to provide a method and an apparatus for RTP in which at least one workpiece can be rapidly heated, in the presence of processing gases or vacuum, by a single heat pulse of short temporal duration.

It is still another object of the present invention to provide a method and an apparatus for RTP in which the temperature of at least one workpiece can be maintained substantially uniform during rapid temperature cycling.

It is still another further object of the present invention to provide an apparatus for RTP which has a curved, horizontally oriented cavity structure that supports a plurality of zones with walls that are maintained at working temperatures.

It is yet another further object of the present invention to provide a method and an apparatus for RTP which utilizes a transport mechanism that is capable of carrying one or more workpieces unidirectionally through a horizontal processing chamber within a curved or linear cavity.

SUMMARY OF THE INVENTION

In accordance with the present invention, a method and an apparatus for RTP are provided wherein the temperature for at least one homogeneous workpiece can be increased and decreased uniformly at rates that are much greater than 150° C. per second without the drawbacks and shortcomings of conventional RTP methods.

In a preferred embodiment, the present invention provides a rapid thermal processing apparatus consisting of a curved cavity that supports a plurality of zones with walls that are maintained at working temperatures, a processing chamber within the cavity, a means for delivering, regulating and i process gases from the chamber, a transport mechanism that carries at least one workpiece through the processing chamber, and a zone for rapid cooling. A rapid thermal processing method can be carried out by first placing at least one wafer in a carrier within the loading zone at one end of the processing chamber. The reaction chamber is purged of unwanted gases and process gases are introduced into the chamber. The wafer carrier is subjected to a controlled forward motion along the reaction chamber and travels through various zones that are maintained at desired temperatures at all times. The processed wafer then enters a cooling zone section of the processing chamber and is finally extracted in the unloading zone at the opposite end of the curved cavity. The wafer is exposed to a temperature excursion having characteristics that are determined by the transport speed, the temperature of each zone, the emissivity of the wafer, and to some extent the ambient gas. An uniform heating of the wafer is controlled by the curved shape of the cavity, The interior wall texture design, the cavity diameter in relation to the diameter of the wafer, and the orientation of the wafer surface in relation to the axis of the cavity.

The present invention is a continuous flow, rapid thermal processing cavity that can be used to manufacture semiconductor devices that are built on semiconducting wafer substrates of any diameter such as those commonly seen in the manufacture of memory and logic circuits used in most advanced digital computers. The RIP cavity provided by the present invention enables the manufacture of advanced memory and logic circuits for which manufacturing and design specifications require fast heating and cooling rates and impose severe limits on the convolution of temperature and time-at-temperature over the entire manufacturing cycle.

The present invention continuous flow RTP cavity is thereby characterized by very fast heating and cooling rates in comparison to what is presently available while maintaining a substantial degree of temperature uniformity over the workpiece, and a substantial degree of reproducability, short cycle time and high throughput. The present invention apparatus is further characterized by the transient heating and cooling of the workpiece in a hot wall reactor in which the workpiece is never allowed to approach near thermal equilibrium with hot walls of the processing cavity, and is further characterized by a continuous, forward motion of the workpiece.

BRIEF DESCRIPTION OF THE DRAWINGS

These and other objects, features and advantages of the present invention will become apparent from the following detailed description and the appended drawings in which:

FIG. 3C is a side view of the wafer carrier shown in FIG. 3B.

FIG. 3D is a partial perspective view of the RTP apparatus of FIG. 2B showing the wafer carrier platform and the guide rollers of FIGS. 3A and 3B.

DETAILED DESCRIPTION OF THE PREFERRED AND THE ALTERNATE EMBODIMENTS

The present invention provides a novel rapid thermal process apparatus and a method for using such apparatus in the heat treatment of at least one wafer. The method is characterized by very fast heating and cooling rates when compared to conventional RTP apparatus while maintaining a substantial degree of temperature uniformity over the wafer, a substantial reproducibility, short cycle time and high throughput. The present invention method is further characterized by the transient heating and cooling of wafers in a hot wall reactor in which the wafers are never allowed to approach near thermal equilibrium with hot walls of the RTP cavity.

The present invention provides a novel hot wall, continuous flow, rapid thermal process reactor for processing not only a single workpiece, but also a plurality of workpieces. The novel continuous flow RTP provides a heating rate that is much higher compared to the heating rate possible in a conventional reactor, i.e., a rate between about 1° C./sec and about 5000° C./sec. The rapid heating rate achievable by the present invention is one of the major advantages when used in the manufacture of high performance semiconductor devices which requires shallow junctions in a process of restricted thermal budget. Such semiconductor devices are frequently fabricated on silicon wafers of any suitable size, i.e., a diameter of 200 mm, 300 mm or any other diameters that can be used in the semiconductor industry for the manufacture of integrated circuit (IC) devices such as for logic or memory. The present invention novel reactor is capable of processing a plurality of wafers together in a continuous fashion where the distance required between wafers is much less than the radius of a wafer. The present invention novel reactor can also process a single wafer, or a continuous succession of single wafers that are separated by a suitable distance that is much larger than the diameter of a wafer. For instance, in the preferred embodiment, a single wafer is processed individually. However, a batch of wafers together or a sequence of wafers positioned at close intervals could be processed using the same reactor but a different wafer transport mechanism based on the alternate embodiments of the invention. In one alternate embodiment, a present invention continuous flow RTP reactor is capable of processing a sequence of four wafers that are spaced apart by several diameters length but are carried simultaneously by the same transport mechanism.

Figure 1A:
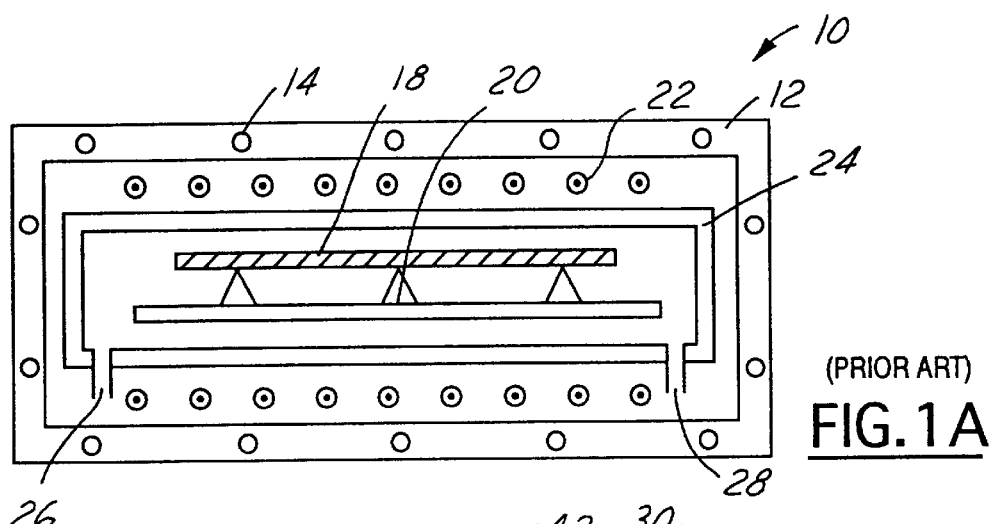
FIG. 1A is a schematic illustrating a cross-sectional view of a conventional lamp based RTP apparatus.
Figure 1B:
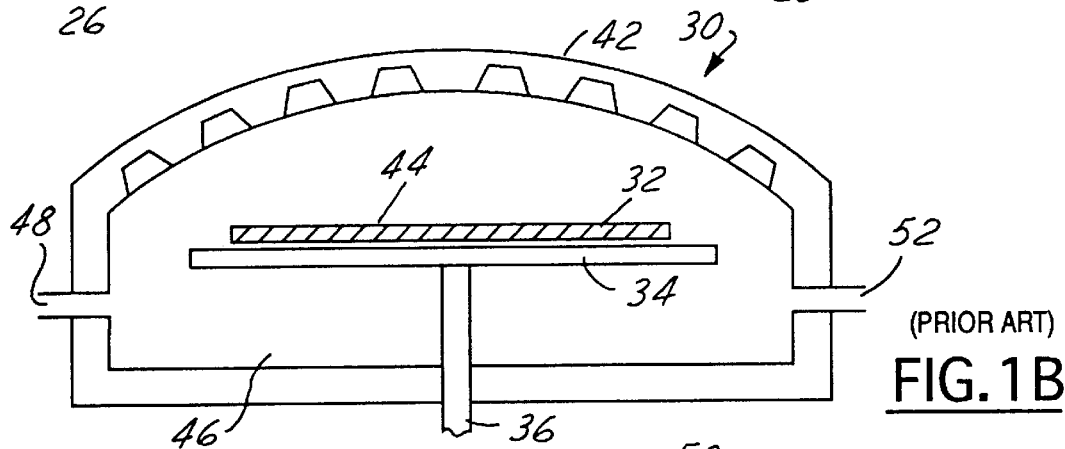
FIG. 1B is a schematic illustrating a cross-sectional view of another conventional lamp based RTP apparatus.
Figure 1C:
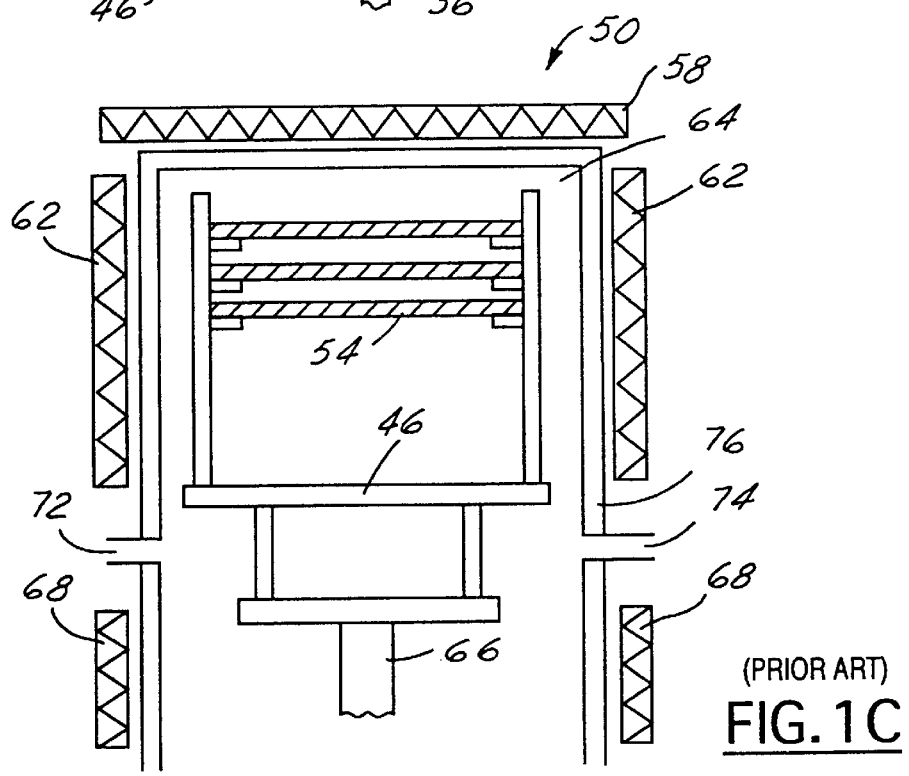
FIG. 1C is a schematic illustrating a cross-sectional view of a conventional furnace based RTP apparatus.
Figure 2A:
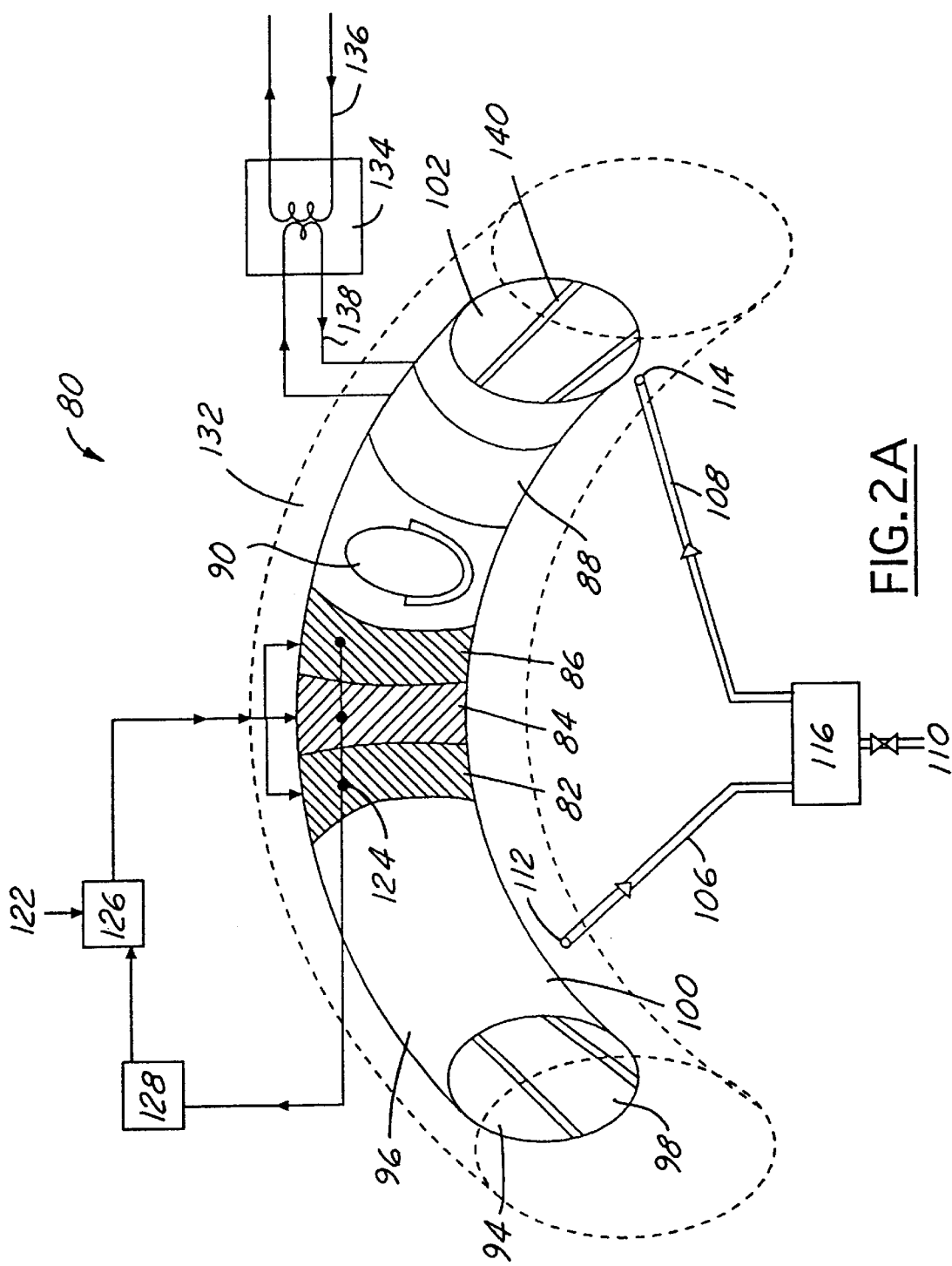
FIG. 2A is a partial perspective view with partial broken away sectional views of a curved section of the present invention RTP apparatus.

Referring initially to FIG. 2A which shows a perspective view of the present invention curved cavity RTP reactor 80 with partially broken-away sections. The apparatus 80 is shown with a geometry that is essentially toroidal or curved and is equipped with a number of hot wall regions 82, 84 and 86 with the desired distribution of internal wall temperature. The apparatus 80 is further equipped with a cooling region 88 for the rapid extraction of heat from workpiece 90 after processing.

As shown in FIG. 2A, the continuous flow RTP reactor 80 is constructed mainly of a toroidal or curved cavity that has an inner wall 94, an outer wall 96, an entrance opening 98 for introducing wafers into the cavity 100 and an exit opening 102 for removing processed wafers from the reactor. Along a section of cavity 100 are high temperature zones 82–86 that have interior wall temperatures preset according to processing specifications. It should be noted that the cross-section of cavity 100 may be circular, rectangular or any other desirable shape. The cavity 100 may have its axis (not shown) oriented at any angle with respect to the vertical. The axis (not shown) of cavity 100 may be curved, i.e., may in fact be a portion of a torpid or other geometrical shape, or may be linear. Internal to cavity 100, a liner or inner wall 94 which has interior walls equipped with a relief geometrical pattern or baffled geometrical pattern (not shown) for the purpose of adjusting radiative heat exchange with the workpiece. At or near the exit opening 102, and downstream from the hating zones 82–86 is a cooling zone 88 where wafers are cooled prior to removal from the continuous RTP reactor cavity 80. The rapid cooling zone 88 mounted on the inner liner 94 may be constructed of an optically transparent envelope (not shown) which carries a fluid having a high emissivity. For instance, a fluid may consist of colloidal suspension of fine carbon particles.

The cavity 80 is further equipped with a number of orifices 112 and 114 for the purpose of introducing gases of various compositions through gas inlet conduit 108, gas outlet conduit 106, flow controller 116 and an external gas supply 110.

The heating of the cavity 80 at the heating zones 82–86 can be achieved by supplying a thermal energy source for each zone. Such source of thermal energy may be as a result of passing an electrical current (AC or DC) through conduits that resist flow of electrical charge, or as a result of causing rapidly alternating currents to flow, as by means of radio frequency (RF) induction, in some zones that are constructed from a partly conducting material such as pyrolitic graphite, or as a result of circulating a liquid (for example, a liquid metal or other liquid) at the desired temperature through hollow conduits or channels, or a result of gas flow (for example, steam, superheated steam or any gas used for the purpose of transferring heat) at the desired temperature through hollow conduits, or as a result of exothermic chemical reaction methods (for example, controlled oxidation of methane, acetylene, or hydrogen) within conduits to produce the desired temperature in the specific heating zone.

The heating zone 82–86 can be constructed of materials that have a high melting or sublimation temperature among which, are (listed with their respective melting temperatures in ° C.): HfC (3928), TaC (2983), C (3800), ZrC (3420), TaN (3440), W (3380), TiC (3067), NbC (3600), and HfN (3387). Other portions of the reactor cavity 80 can be constructed of other materials (listed with their melting temperature in ° C.): $NbB_2$ (2900), B (2300), $CaO_2$ (2500), MgO (2800), Tim (2950), TiB (2900), NbN (2500), and MoC (2700).

As shown in FIG. 2A, an energy source 122 such as an electrical current provides energy to the high temperature zone 82–86 by passing the current through a conduit that resists motion of electrons. A temperature regulating means for maintaining each of the heating zones it a predetermined temperature consists of suitable sensors 124 (for example, a thermocouple sensor, a gas pressure sensor, a resistive sensor, an eutectic sensor, a capacitive sensor, an inductive sensor, or an oscillating element whose frequency depends on temperature) and a temperature controller 126. A feedback controller 128 is also used to regulate the temperatures of the heating zones 82–86. The temperature regulating means therefore includes one of the above suggested temperature sensors, a temperature controller 122 and a feedback controller 128 for processing the sensor signal and utilizing it in a feedback control to increase or decrease energy flow to the heating zones such that the temperature of the zone can be maintained within a narrow range.

Between outer wall 96 and outer enclosure 132 and near the heated zones 82~86 of the cavity 80, thermal barrier devices (not shown) for minimizing heat energy flow to the environment may be installed which consists of a number of radiation barriers (or low emissivity layers), a number of barriers to heat conduction (such as layers of materials with low heat conduction capability, or a vacuum layer) and a number of barriers to heat transport by convection by eliminating gas pockets. A geometrical tapering in the internal dimensions of the zones is appropriate for achieving variations in the temperature distribution over the workpiece. A sequence of fins, baffles or reliefs on the inner surface of each heating zone which can be oriented at various angles to the workpiece 90 can also be provided to achieve more or less efficient radiative heat transfer as desired. This enables the workpiece to achieve a more uniform temperature distribution over its entire surface.

A rapid heat extraction zone (or cooling zone) 88 for the rapid cooling of the wafer 90 is provided which consists of high emissivity cold wall interior surfaces and forced convective cooling from flowing gases. The cooling zone 88 is controlled by a heat exchanger 134, a coolant flow 136 and a high emissivity cooling fluid 138.

An outer protective skin (or outer enclosure) 132 is provided for controlling the gaseous environment external and internal cavity 100. A detailed illustration of the transport system will be shown in FIGS. 2B, 2C and 2D.

Figure 2B:
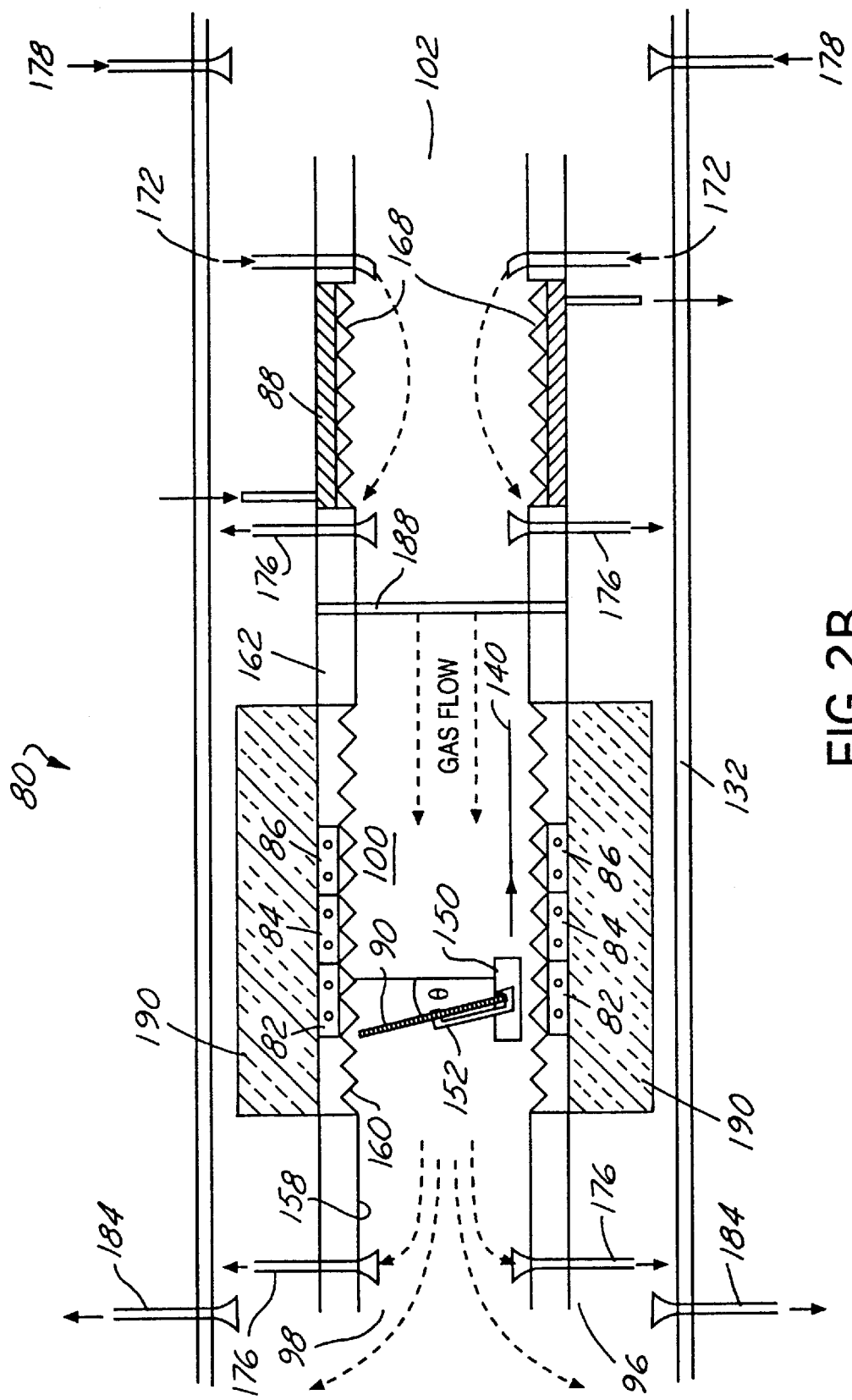
FIG. 2B is a side cross-sectional view of the RTP apparatus of FIG. 2A showing the transporting means for wafers and the heating and cooling zones.

FIG. 2B is a cross-sectional view of the present invention continuous flow RTP cavity 80 of FIG. 2A. The wafer (or plurality of wafers) 90 is carried through the cavity 80 on a carrier 50 that rides on rails 140. This is shown in FIG. 2B. Wafers enter the processing cavity at 98 and exit at 102 in a continuous, uninterrupted motion. The transport mechanism for moving the wafers through cavity 80 consists of a rail system 140 (shown in FIGS. 2B, 2C and 2D), a carrier 150 that rides on rails 140, a wafer paddle 152 which holds the wafer securely in place when moved on the carrier and which is mounted to the carrier 150.

The rails 140 may be constructed from a suitable material such as tungsten. The carrier 150 and the paddle 152 may be constructed from a suitable material such as fused silica such that these which are designed only to carry the workpiece, can rise to a temperature that is much less than that of the workpiece during transit through the cavity 80. The rails 140 may include two or more rails arranged along the axis of the cavity 80. A link chain or cable 156, as shown in FIG. 2D, with suitable mechanical harness can be used for moving carrier 150. A passive, automatic engagement system (not shown) such as a gravity activated flap or a retractable hook can be used for engaging or disengaging the carrier 150 from the rails 140. A separate speed control (not shown) is used to drive the chain or cable which may be preprogrammed. A rail switching mechanism (not shown) for switching carrier 150 from different rail segments such as various wafer loading stations onto the track can be used so that the wafers can be transported into and out of the continuous flow RTP chamber 80.

FIG. 2B further illustrates the preferred embodiment of the present invention continuous flow RTP chamber wherein the cavity inner wall liner 158 is equipped with a textured surface 160 as a relief for uniformity control. Heating zones 82, 84 and 86 are also provided in the cavity inner wall liner 158 which consists of power conduits enclosed in ceramic material such as Hf. A barrier 190 to minimize the rate of heat transport from hot zones 82~86 is placed between outer cavity wall 96 and outer enclosure 132. A transition section 162 is provided between the heating zones 82~86 and the cooling zone 88. The result of the motion through the heating zones 82-88 of the cavity 80 is that wafer 90 experiences a substantially uniform temperature rise whose rate, peak and duration depend solely on the wafer rate of motion, temperatures of heating zones and emissivity properties of the wafer. The wafer position and the rate of motion can be sensed by a sensor (not shown) and regulated by a motion regulator (not shown). Finally, the wafer is transported to a cooling zone (or a heat extraction zone) 88 where the wafer experiences a substantially uniform temperature drop at a rate that is, in part determined by the cooling zone wall temperature and the cooling gas flow rate.

A substantially uniform temperature is a temperature distribution over the entire wafer that yields process results of an acceptable quality for the particular process being performed, for example, annealing after ion implantation may require that the highest and lowest temperature anywhere across a wafer vary by not more than 3° C. for an average wafer temperature of 1000° C.

It is seen that a textured surface 168 is also provided in the cooling zone 88 for increasing coding rate of the workpiece. A high emissivity fluid, 138 in FIG. 2A is flown through the cooling zone 88 together with a cooling gas flow 172 for achieving rapid cooling of the wafers. The cooling gas flow 172 exits the chamber 100 through gas outlet 176. Similarly, a cooling and non-reactive gas flows in the outer environment between outer enclosure 132 and outer cavity 100, entering at 178 and outflowing at 184. A baffle plate 188 is provided for thermal isolation between the heating zones 82~86 and the cooling zone 88, and further restricts cooling gas flow from the cooling zone 88 to the hot region of the cavity 100. It should be noted that cavity 80 can be provided either in a curved section or in a linear section, but preferably, in a toroidal section.

The movement of wafer 90, positioned at an angle θ with respect to a vertical axis, through chamber 100 creates an interaction with the heat waves emitted from the heating zones 82~86 such that the workpiece experiences heat impulses consisting of continuous, convolution or superposition of impulses of electromagnetic radiation. It has been proven that within a closed cavity each of the imposes has a spectral distribution of power that is substantially similar to that of an ideal black body radiator. This is one of the key advantages that are made possible by the present invention in providing a continuous flow, rapid heating/cooling RTP apparatus and method.

Figure 2C:
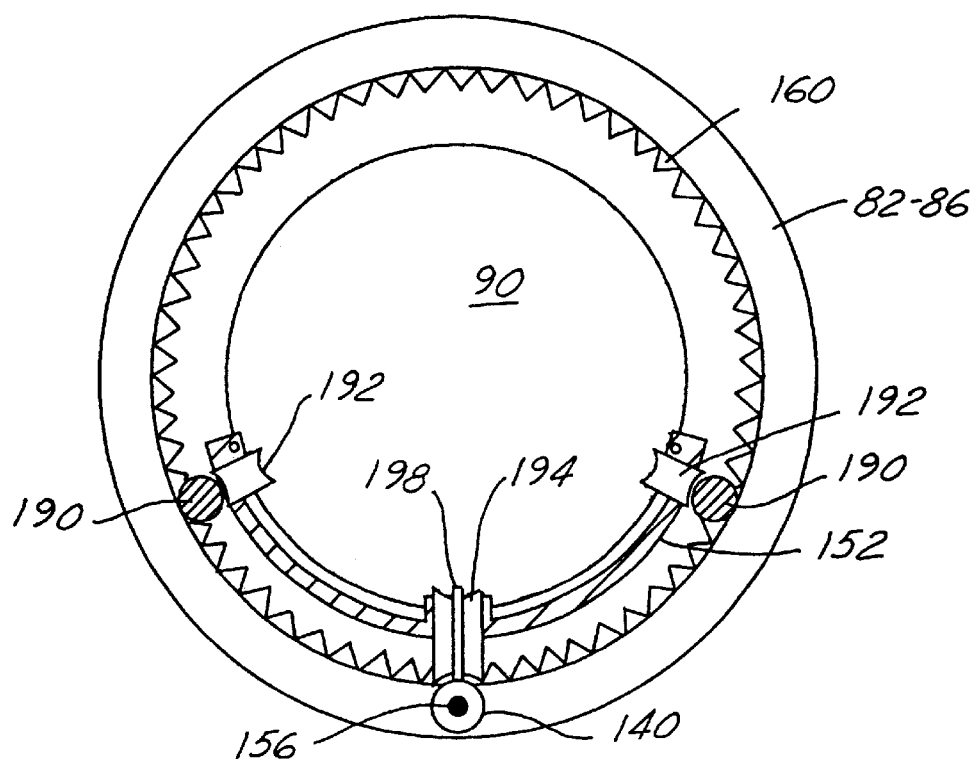
FIG. 2C is an end cross-sectional view of the curved cavity of the present invention RTP apparatus showing a detailed transport mechanism.
Figure 2D:
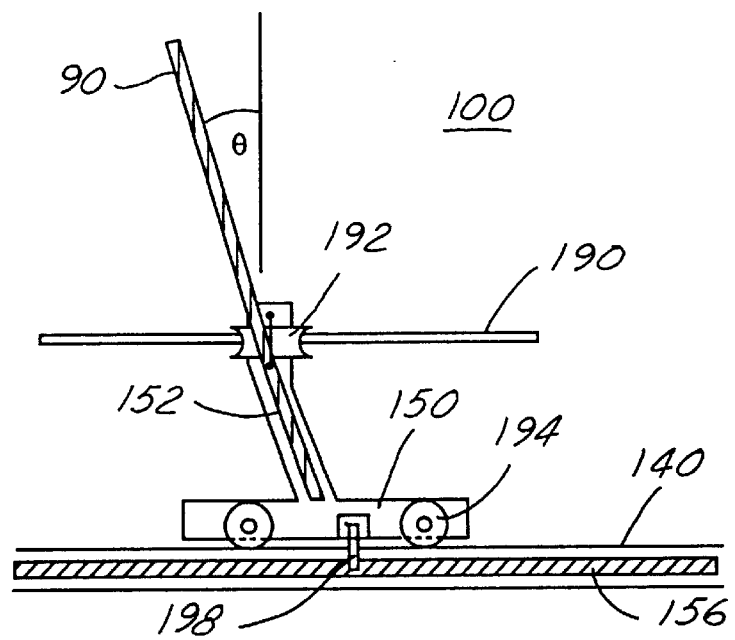
FIG. 2D is a side view of a wafer-transporting carrier for the present invention apparatus.

A detailed illustration of the carrier 150, the paddle 152 and the guide rail system 190 is shown in FIGS. 2C and 2D. A wafer 90 is positioned in the paddle 152 on the carrier 150 at an angle θ from the vertical axis. The angle can be suitably selected between 0 and about 60° to allow heated gas to flow through and around the outer peripheral edge of the wafer 90. The inner wall relief, or a textured surface 160 is provided on the heating zones 82~86 such that a more uniform wafer temperature in the RTP chamber can be achieved. The wafer holder or paddle 152 can be made of a thin fused silica material such that it remains at a much lower temperature than that achieved by the wafer 90. At the upper extremities of the wafer paddle 152, guide rollers 192 (usually provided as a pair) are provided for moving the carrier 150 which rides on the guide rails 190 through the chamber 100. The movement of the carrier 150 is controlled by the guide rollers 192, which can also be suitably manufactured of fused silica, and are mounted to the carrier 150. A drive pin 198 is provided to the carrier 150 such that it can be engaged to a drive cable 156 for pulling the carrier through the chamber 100 when the wheels 194 ride securely on the drive rail 140. It should be noted that the transport mechanism illustrated in FIGS. 2C and 2D is merely one of many possible embodiments for the transport system in the present invention novel continuous flow RTP apparatus.

Figure 3A:
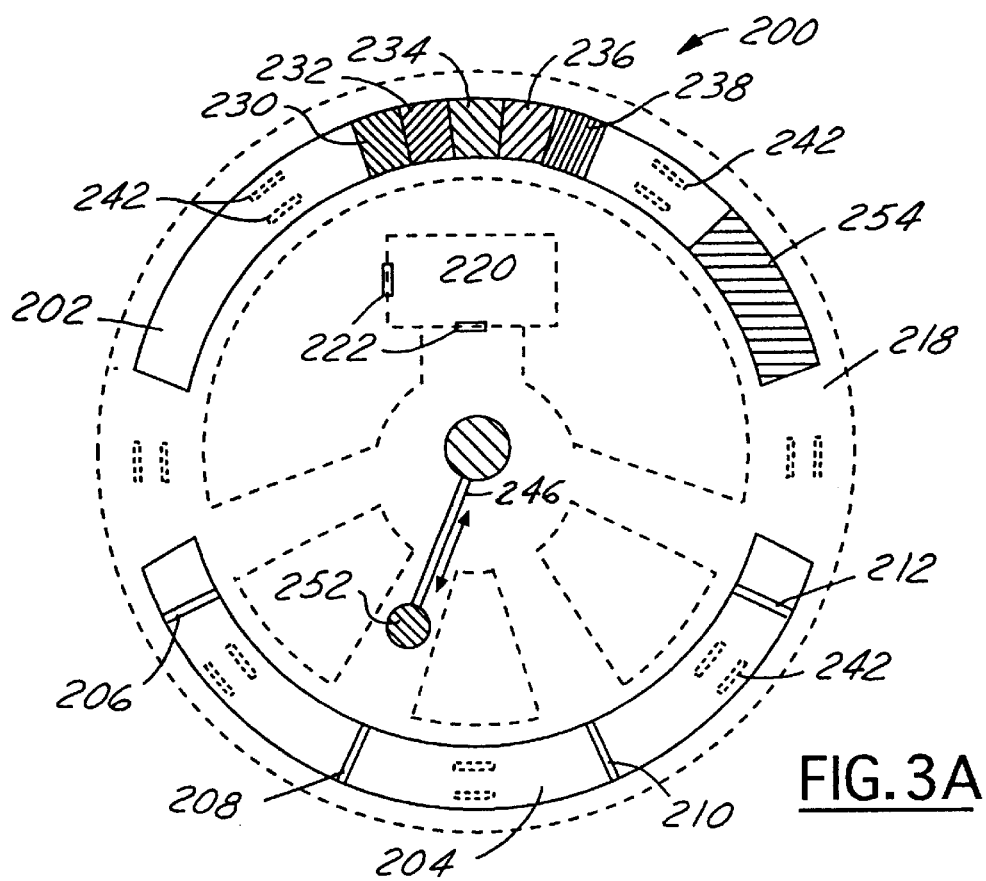
FIG. 3A is a plan, top view showing the curved cavity in relation to loading aid unloading zones and a wafer carrier means.

FIG. 3A is a top view showing a curved cavity similar to that in FIG. 2A, but with a second embodiment of a wafer transport mechanism and showing an embodiment for wafer loading and unloading mechanism. In FIG. 3A, a toroidal processing chamber 202 and a wafer carrier 204 for carrying three or more wafers are provided; four wafers 206~212 are carried by the carrier 204. A controlled environment enclosure 218 is provided which completely encompasses the carrier 204, the processing chamber 202, the loading and unloading station 220 equipped with doors 222. In the processing chamber 202, heating zones 230~238 of a hot wall design and cooling zone 254 are utilized to heat/cool the wafers as they pass through the heated/cooled section on the carrier 204. A plurality of rolling guides 242 are provided for the transport of carrier 204, i.e., a total of seven pairs are shown in FIG. 3A. The wafers are loaded from the loading/unloading station 220 by a mechanical robot loader 246 onto wafer paddles (not shown) pre-positioned on carrier 204. A wafer 252 is shown in FIG. 3A in the process of being loaded by the robot loader 246.

Figure 3B:
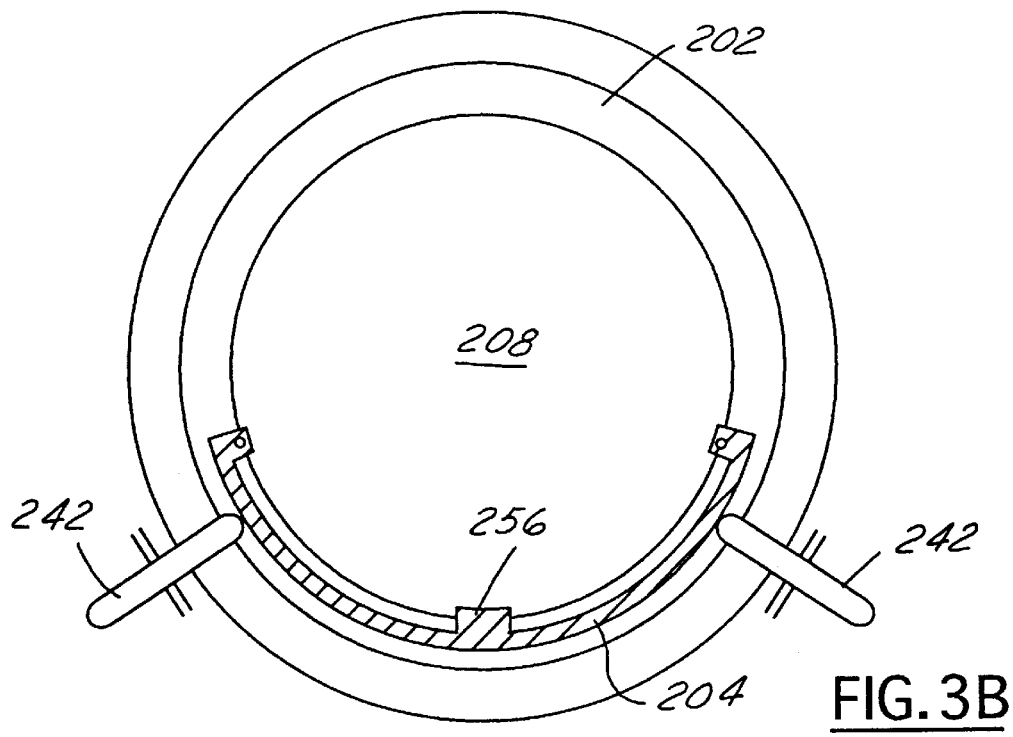
FIG. 3B is an end cross-sectional view of the curved cavity of the present invention RTP apparatus of FIG. 3A showing a second embodiment of a wafer being carried by the wafer carrier.

FIG. 3B is a cross-sectional view of the alternate wafer transport embodiment of the continuous flow RTP apparatus 200 shown in FIG. 3A In the processing chamber 202, a wafer 208 is carried by the wafer carrier 204 and secured by the wafer paddle 256 and is guided by rolling guides 242 that also provide locomotion.

FIG. 3C is an enlarged, side view of the wafer 208 being transported on a carrier 204 and wafer paddle 256. The wafer 208 is mounted such that its surface lies in a plane that makes an angle θ with the vertical axis. The paddle 256 is normally constructed of fused silica, aluminum oxide or any other suitable high temperature material. The paddle 256 makes a minimal contact with the outer edge of the wafer 208 when the wafer is being transported through the RTP chamber 202. FIG. 3D is a perspective view of the RTP apparatus 200 shown in FIG. 3A showing only wafer carrier 204 without wafer paddle 256, and guide rollers 242. It should be noted that windows 272 are provided in carrier 204 to reduce weight and provide improved gas flow and temperature uniformity inside the RTP chamber 202.

Figure 4A:
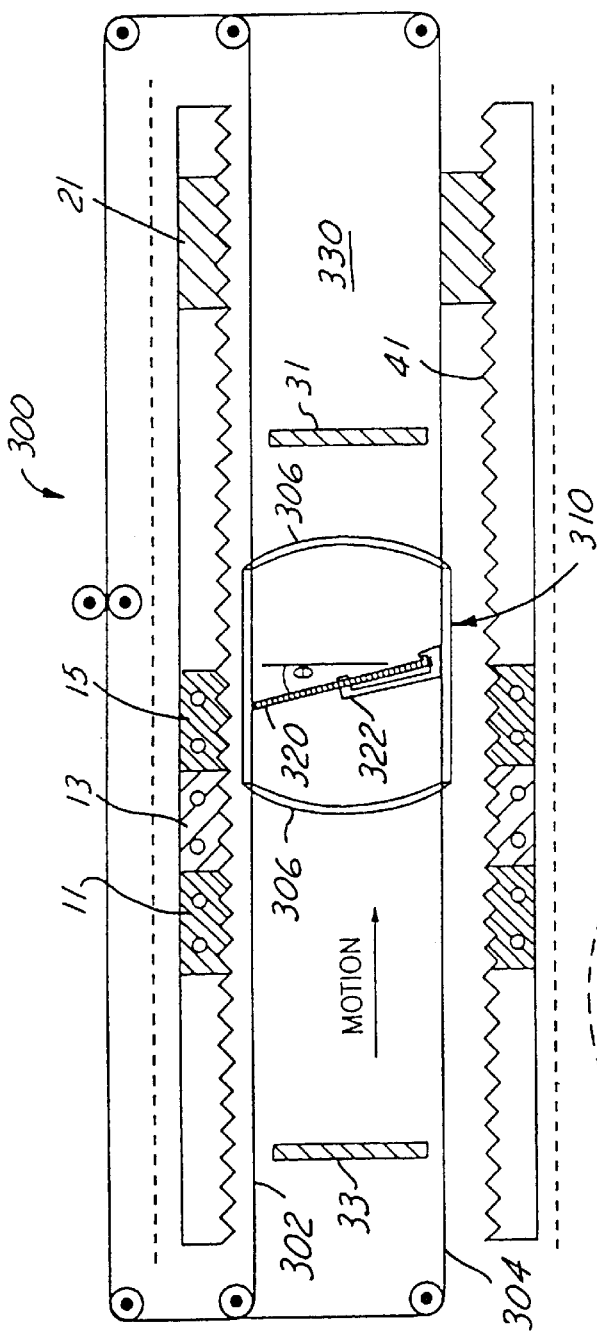
FIG. 4A is a side cross-sectional view of the present invention RTP apparatus in a second embodiment utilizing a linear instead of curved cavity and a cable transport for workpiece.

A second alternate embodiment of the present invention continuous flow RTP apparatus 300 is shown in a cross-sectional view in FIG. 4A. In this second alternate embodiment, the RTP cavity is laid out in a linear fashion, instead of in a toroidal shape. The wafer transport is effected by means of a third embodiment, a top cable 302, a bottom cable 304 and a carrier frame 306 attached to guide tubes 310 through which pass drive cables 302 and 304. The cavity embodiment of FIG. 4A differs from that of FIGS. 2A or 3A only in that its axis lies in a straight line. Other components such as heating zones 11~15, cooling zone 21, interior wall geometry 41 gas flow (not shown), outer enclosure, and barrier to heat flow are essentially the same as those described in conjunction with FIGS. 2A and 3A.

Figure 4C:
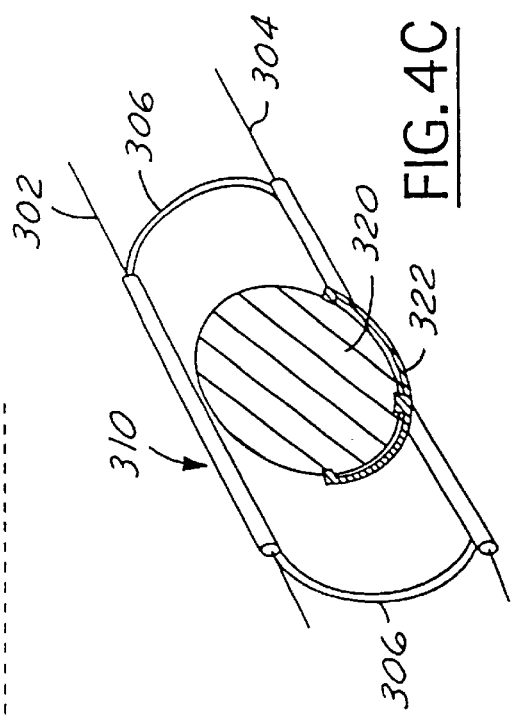
FIG. 4C is a perspective view of the wafer carrier shown in FIG. 4A
Figure 4B:
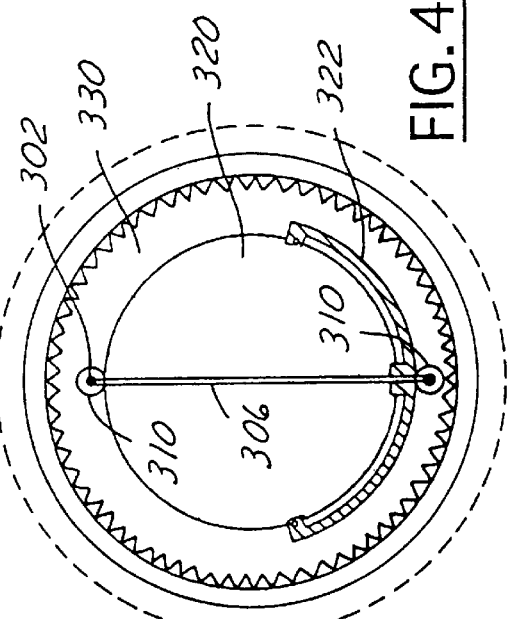
FIG. 4B is an end cross-sectional view of the linear cavity of FIG. 4A showing a third embodiment of the wafer carrier.

In the linear cavity, baffles 31 and 33 are essential to prevent extensive heat loss from open ends. FIGS. 4B and 4C shows an end cross-sectional view of the apparatus 300 and a perspective view of the wafer carrier 310, 306, respectively. A wafer 320 is transported on a carrier frame 306 (attached to guide tubes 310 through which pass drive cables 302 and 304) wherein the wafer 320 is mounted in such a way that its surface lies in a plane that makes an angle θ with the vertical axis. The wafer 320 is held in a wafer paddle 322 that is fixed to the carrier frame 306 which is attached to guide tubes 310. The wafer carrier, 322, 306 and 310 can be constructed of fused silica, aluminum oxide or any other suitable high temperature material. The wafer paddle 322 makes minimal contact with the outer edge of the wafer 320 when the wafer is transported through the RTP cavity 300 on a top and bottom cable 302 and 304 with the two cables simultaneously pulling the wafer carrier composed of components 306, 310 and 322.

INDUSTRIAL APPLICABILITY

An important aspect of the present invention apparatus is the ability to rapidly increase and decrease the temperature of an entire wafer wherein the wafer temperature remains substantially uniform across its surface at all times. The present invention RTP apparatus and method can be used to perform all of the processes performed by conventional RTP reactors. For instance, all anneal and dopant activation processes can be carried out in the present invention RTP chambers. It is known that the fraction of dopant activation depends on the time at peak temperature, the dopant specie, the dopant concentration and the implantation energy, while the diffusion distance of implanted species depends on an integration of time and temperature, and the dopant specie. For example, when arsenic ions, having an energy of 30 keV, are implanted into nominally oriented silicon with a dose of $10^{15}cm^{-2}$, the silicon lattice returns to a predominantly damage-free state and the implanted ions become predominantly activated when the implanted silicon is heated to 1080° C. for a period of 20 seconds. The present invention RTP apparatus and method provides the ability to reach peak temperatures much more quickly and with substantially uniform temperature across an entire wafer than is possible with conventional RTP reactors. The ability to heat the entire wafer very rapidly and uniformly is important for the formation of ultra shallow dopant profiles and for optimizing the overall heat exposure which a wafer undergoes during the entire manufacturing cycle. The ability to raise the wafer temperature quickly to the desired process temperature minimizes exposure of the wafer to lower temperatures that do not contribute to the process at hand but, nevertheless add to the total amount of heat that a wafer is allowed to be exposed to during the entire manufacturing cycle.

In addition to annealing, the present invention RTP apparatus and method can be used to sinter metal contacts. To achieve a good metal-semiconductor contact after deposition, the metal-semiconductor combination is heated to a temperature at which some interdiffuision and alloying occurs at the metal-semiconductor interface. For example, for aluminum, the temperature is typically in the range between about 430° C. and about 510° C. in either an inert gas atmosphere or in one which contains hydrogen for a time that may vary from about 5 to about 30 seconds.

In addition to annealing and sintering, the present invention RTP apparatus and method can be used to form ohmic silicide contacts to silicon devices. In this process, a thin layer of metal is deposited over the wafer and the entire wafer is then heated to form a metal-silicide contact at the interface between the metal film and silicon while the excess metal is subsequently etched away. The formation of a metal silicide that has the desired composition and resistivity is dependent upon the heating rate, the formation temperature and the anneal temperature. For example, refractory metal-silicide are generally formed by first heating the previously deposited thin metal on a silicon carrier to about 700° C. for a period of about 30 seconds, etching away unused metal and subsequently heating the wafer to about 900° C. for about 5 seconds. In addition to annealing, sintering and the formation and annealing of various metal-silicon compounds, the present invention RTP apparatus and method can be used to form films of various chemical composition, on surfaces, from vapors and gases of various chemical composition and proportional concentrations.

As examples, the present invention RTP and method can be used to grow silicon films from silane gas on various surfaces; to grow silicon dioxide glass films from dichlorosilane and nitrous oxide gases on various surfaces; and silicon nitride from dichlorosilane and ammonia gases on various surfaces.

While the present invention has been described in an illustrative manner, it should be understood that the terminology used is intended to be in a nature of words of description rather than of limitation.

Furthermore, while the present invention has been described in terns of a preferred and alternate embodiment, it is to be appreciated that those skilled in the art will readily apply these teachings to other possible variations of the inventions.

The embodiment of the invention in which an exclusive property or privilege is claimed are defined as follows:

1. An apparatus in which at least one workpiece is subjected to a single pulse of heat; said single pulse of heat comprising a continuous superposition of pulses of electromagnetic radiation; each said pulse of electromagnetic radiation having a spectral distribution of power closely resembling that of an ideal black body radiator at a temperature between about 20° C. and about 3,000° C., said at least one workpiece is a semiconductor wafer selected from the group consisting of a 127 mm diameter wafer, a 152 mm diameter wafer, a 203 mm diameter wafer and a 305 mm diameter wafer.

2. An apparatus according to claim 1 further comprising a processing chamber within said cavity, a means for providing a process gas to said chamber, a transport means for carrying at least one workpiece through said chamber in a substantially forward direction, a heating means for heating at least a section of said chamber, and a cooling means for cooling said at least one workpiece.

3. An apparatus according to claim 1 for heating at least one workpiece at a heating rate between about 1° C./sec and about 5000° C./sec.

4. An apparatus according to claim 1, wherein said at least one workpiece is a semiconductor wafer.

5. An apparatus according to claim 1, wherein said cavity is either curved or linear.

6. An apparatus according to claim 1, wherein said cavity is toroidal.

7. An apparatus for continuous heat treating at least one workpiece comprising a cavity of generally elongated shape for generating heat impulses produced by an interaction between a moving carrier that carries said at least one workpiece in a substantially forward direction and a stationary heated wall section of said cavity, said heat impulses generated provide transient heat to said at least one workpiece such that no thermal equilibrium is reached between said at least one workpiece and said heated wall section of said cavity.

8. An apparatus according to claim 7, wherein said heat impulses generated are a continuous convolution of nearly black body distributions of electromagnetic radiation.

9. An apparatus for continuous heat treating at least one workpiece comprising a cavity of generally elongated shape for generating a heating rate on said at least one workpiece at not less than 150° C. per second.

10. An apparatus according to claim 9, wherein said cavity of generally elongated shape generates a heat rate on said at least one workpiece at between about 150° C./sec and about 1000° C./sec.

11. An apparatus according to claim 9, wherein said at least one workpiece is a semiconductor wafer having a diameter between about 125 mm and about 305 mm.

12. An apparatus according to claim 9, wherein said at least one workpiece moves at a substantially constant speed in a substantially forward direction through said cavity while being heated by a hot wall section of said cavity.

* * * * *